United States Patent
Symons et al.

(10) Patent No.: US 10,340,951 B2
(45) Date of Patent: Jul. 2, 2019

(54) SOFT DECISION LDPC DECODER WITH IMPROVED LLR FROM NEIGHBORING BITS

(71) Applicant: Toshiba Memory Corporation, Minato-ku, Tokyo (JP)

(72) Inventors: David Symons, Oxon (GB); Paul Hanham, Wiltshire (GB); Francesco Giorgio, Oxon (GB)

(73) Assignee: Toshiba Memory Corporation, Tokyo (JP)

( * ) Notice: Subject to any disclaimer, the term of this patent is extended or adjusted under 35 U.S.C. 154(b) by 104 days.

(21) Appl. No.: 15/702,967

(22) Filed: Sep. 13, 2017

(65) Prior Publication Data
US 2019/0081641 A1    Mar. 14, 2019

(51) Int. Cl.
*H03M 13/11* (2006.01)
*G06F 3/06* (2006.01)

(52) U.S. Cl.
CPC ......... *H03M 13/1125* (2013.01); *G06F 3/065* (2013.01); *G06F 3/0619* (2013.01); *G06F 3/0688* (2013.01)

(58) Field of Classification Search
CPC .. H03M 13/1125; G06F 3/0619; G06F 3/065; G06F 3/0688
USPC ....... 714/758, 759, 793, 768, 769, 773, 774, 714/780, 799; 365/185.09, 185.03, 365/185.24
See application file for complete search history.

(56) References Cited

U.S. PATENT DOCUMENTS

| | | |
|---|---|---|
| 9,117,529 B2 | 8/2015 | Karakulak et al. |
| 9,235,467 B2 | 1/2016 | Micheloni et al. |
| 9,329,935 B2 | 5/2016 | Cohen et al. |
| 9,337,865 B2 | 5/2016 | Cohen et al. |
| 9,397,701 B1 | 7/2016 | Micheloni et al. |
| 9,407,294 B2 | 8/2016 | Hanham et al. |
| 9,450,610 B1 | 9/2016 | Micheloni et al. |
| 9,454,414 B2 | 9/2016 | Micheloni et al. |
| 9,576,671 B2 | 2/2017 | Karakulak et al. |
| 9,590,656 B2 * | 3/2017 | Micheloni .......... H03M 13/1111 |

(Continued)

OTHER PUBLICATIONS

Aslam et al., Read and Write Voltage Signal Optimization for Multi-Level-Cell (MLC) NAND Flash Memory, Apr. 2016, IEEE, vol. 64, No. 4, pp. 1613-1623. (Year: 2016).*

(Continued)

*Primary Examiner* — John J Tabone, Jr.
(74) *Attorney, Agent, or Firm* — White & Case LLP

(57) ABSTRACT

A method of providing, by a controller, a log likelihood ratio (LLR) to a low-density parity check (LDPC) decoder, the method comprising storing, in a non-volatile memory controller, a look-up table for storing LLR values of at least one bit representing a charge state of a cell of the plurality of cells in the memory. The controller determines a cell charge state of the target cell, calculates a value representative of the difference in charge states of the target cell and at least one of a plurality of neighboring cells. The controller compares the calculated value with at least one predetermined threshold value, and sets at least one address bit of an address to the look-up table if the calculated value exceeds the at least one threshold value. The controller extracts a new LLR value from the look-up table, and provides the new LLR value to the LDPC decoder.

24 Claims, 4 Drawing Sheets

(56) References Cited

U.S. PATENT DOCUMENTS

| | | | |
|---|---|---|---|
| 9,720,754 B2 | 8/2017 | Karakulak et al. | |
| 9,735,990 B2 * | 8/2017 | Sugihara | H04L 27/38 |
| 2007/0183220 A1 * | 8/2007 | Aritome | G11C 16/3418 |
| | | | 365/185.29 |
| 2009/0113259 A1 * | 4/2009 | Aritome | G11C 16/28 |
| | | | 714/721 |
| 2009/0303788 A1 * | 12/2009 | Roohparvar | G11C 11/5628 |
| | | | 365/185.02 |
| 2011/0235414 A1 * | 9/2011 | Ikeda | G11C 11/5628 |
| | | | 365/185.03 |
| 2013/0145235 A1 | 6/2013 | Alhussien et al. | |
| 2013/0185598 A1 | 7/2013 | Haratsch et al. | |
| 2014/0281800 A1 * | 9/2014 | Micheloni | G06F 11/1012 |
| | | | 714/759 |
| 2014/0281822 A1 | 9/2014 | Wu et al. | |
| 2014/0281823 A1 * | 9/2014 | Micheloni | G06F 11/1012 |
| | | | 714/773 |
| 2014/0281828 A1 * | 9/2014 | Micheloni | G06F 11/00 |
| | | | 714/773 |
| 2016/0006462 A1 | 1/2016 | Hanham et al. | |
| 2016/0306694 A1 * | 10/2016 | Tai | H03M 13/2957 |
| 2017/0134193 A1 * | 5/2017 | Sugihara | H04L 27/38 |
| 2017/0236592 A1 * | 8/2017 | Alhussien | G11C 29/50004 |
| | | | 714/721 |
| 2017/0255518 A1 * | 9/2017 | Achtenberg | G06F 3/0619 |
| 2017/0288699 A1 * | 10/2017 | Yang | H03M 13/1108 |
| 2017/0300252 A1 * | 10/2017 | Yim | G06F 3/0619 |
| 2018/0276072 A1 * | 9/2018 | Kodama | G06F 11/1068 |
| 2018/0287635 A1 * | 10/2018 | Djurdjevic | H03M 13/1111 |

OTHER PUBLICATIONS

Guiqiang Dong et al., "On the Use of Soft-Decision Error-Correction Codes in NAND Flash Memory," IEEE Transactions on Circuits and Systems—I: Regular Papers, vol. 58, No. 2, Feb. 2011, pp. 429-439.

Jonghong Kim et al., "Low-energy Error Correction of NAND Flash Memory Through Soft-Decision Decoding," EURASIP Journal on Advances in Signal Processing 2012, 2012:195, SpringerOpen Journal, pp. 1-12.

* cited by examiner

| | ER | A | B | C | D | E | F | G |
|---|---|---|---|---|---|---|---|---|
| LSB | 1 | 0 | 0 | 0 | 0 | 1 | 1 | 1 |
| CSB | 1 | 1 | 0 | 0 | 1 | 1 | 0 | 0 |
| MSB | 1 | 1 | 1 | 0 | 0 | 0 | 0 | 1 |

| State | Min Score | Max Score | Example Threshold | Neighbor combinations |
|---|---|---|---|---|
| ER | 0 | +14 | +10 | D_G, E_F, E_G, F_G, G_G, F_F |
| A | -2 | +12 | +10 | F_G, G_G |
| B | -4 | +10 | +9 | G_G |
| C | -6 | +8 | +9 | None |
| D | -8 | +6 | -9 | None |
| E | -10 | +4 | -9 | ER_ER |
| F | -12 | +2 | -10 | ER_A, ER_ER |
| G | -14 | +0 | -10 | ER_ER, ER_A, ER_B, ER_C, A_A, A_B |

SOFT DECISION LDPC DECODER WITH IMPROVED LLR FROM NEIGHBORING BITS

FIELD OF THE INVENTION

The present disclosure relates to solid-state storage device controllers and methods that improve the accuracy of a log likelihood ratio (LLR) assigned to a bit of a codeword of a soft decision Low Density Parity Check (LDPC) Decoder.

BACKGROUND

Improvements in NAND flash memory technology have led to reduced solid state device geometries and increased bit density of nonvolatile NAND flash memories. This has lead to, accordingly, an increase in error rates of data decoded from such memories. One type of error correction code commonly employed in nonvolatile memory storage modules are low-density parity-check (LDPC) codes. An LDPC code is a linear error correcting code having a parity check matrix with a small number of non-zero elements in each row and column.

The power of LDPC codes resides in the ability of the decoder to exploit so-called 'soft' information on the stored data. For example, in single level cell (SLC) memory, two charge states represent the two possible states: '0' and '1', of the cells within the NAND chips. In MLC memory, four charge states represent the 4 possible states: '00', '01', '10' and '11', TLC memory has eight charge states, and so on. When data is stored, charge programming variations cause the programmed charge state to be an analogue quantity which varies according to a statistical distribution rather than a discrete value. Further, charge distributions of different states may overlap and stored charge may drift over time. To read the data, a voltage threshold is applied to determine in which charge state the cell lies, providing a binary result (above or below the threshold). A single threshold suffices for SLC to provide a 0/1 result and for MLC and TLC results from multiple thresholds provide multiple bits. To determine more accurate information on charge state, further reads known as 'soft reads' provide extra bits of soft information which are expressed by a log likelihood ratio (LLR) which LDPC decoders can make use of to perform decoding. The LLR attributed to a bit is representative of the probability that the charge state value read corresponds to a '0' or a '1'. The sign of the LLR typically provides the bit estimation (i.e. positive LLR corresponds to '1' and negative LLR corresponds to '0' according to one convention). The magnitude of the LLR provides the reliability of the estimation (i.e. |LLR|=0 means that the estimation is completely unreliable and |LLR|=00 means that the estimation is completely reliable and the bit value is known). The decoding performance of the soft decision LDPC decoder depends on the accuracy of the LLR values.

Reading soft information from the NAND memory array requires multiple reads at varying threshold voltages. Due to the high memory cell density in flash memory arrays, the reads from a cell in a memory array may be influenced by the level of neighboring bits in the page. This degrades the quality of the read. In particular, there are 'bad' sequences of levels which are more likely to lead to errors when the page is read. Further, performing multiple reads is time consuming and has a severe negative impact on the performance of the flash memory controller. As such, there is a long-felt need to obtain LLR data with improved accuracy to obtain quality LLR data that will be useful in the decoding process.

SUMMARY OF INVENTION

The present disclosure relates to a method of providing a log likelihood ratio (LLR) of at least one bit representing a charge state of a target cell of a plurality of cells of a non-volatile memory to a low-density parity check (LDPC) decoder, each of the plurality of cells capable of being in any one of a plurality of cell charge states. The method comprises storing in a non-volatile memory controller, a look-up table for storing LLR values of at least one bit representing a charge state of a cell of the plurality of cells in the memory. The controller determines a cell charge state of the target cell and a cell charge state of at least one of a plurality of neighboring cells. The controller then calculates a value representative of the difference in at least one of a plurality of charge states of the target cell and the at least one of the plurality of neighboring cells. The controller compares the calculated value with at least one predetermined threshold value representative of the degree of disturbance effect the charge state of the at least one of the plurality of neighboring cells has on the charge state of the target cell. The controller then sets at least one address bit of an address to the look-up table if the calculated value exceeds the at least one threshold value. The controller then extracts a new LLR value from the look-up table using the at least one address bit, and provides the new LLR value of the at least one bit representing the charge state of the target cell to the LDPC decoder.

In some implementations, determining the cell charge state of the target cell or neighboring cell comprises performing multiple reads on each target cell or neighboring cell at varying threshold voltages. In certain implementations, the method further comprises assigning a numerical value to each of the plurality of cell charge states. In some implementations, the plurality of cell charge states and their associated numerical values are stored in the non-volatile memory controller. In certain implementations, the at least one threshold value varies according to the cell charge state of the target cell. In some implementations, the at least one threshold value varies according to a length of time since the target cell was programmed with charge. In certain implementations, the at least one threshold value varies according to a total number of program and erase cycles the target cell has been subjected to. In some implementations, the variation in threshold value with cell charge state of the target cell may be linear or may be determined by a mathematical function.

In certain implementations, the method further comprises counting, by the non-volatile memory controller, the number of times a LLR value in a particular location in the look-up table is used to assign a LLR to the at least one bit representing the charge state of a cell, and counting, by the non-volatile memory controller, the number of times the at least one bit representing the charge state of the cell was a specific value at a specific location in the look-up table. The memory controller then calculates a new probability that the at least one bit representing the charge state of the cell is the specific value, and adjusting the LLR value at the specific location in the look-up table according to the new probability.

In some implementations, the non-volatile memory is a flash memory. In certain implementations, the non-volatile memory comprises any one of: single level cells (SLCs), multi-level cells (MLCs), triple level cells (TLCs) and quadruple level cells (QLCs). In some implementations, the plurality of cells of the non-volatile memory is capable of being in any one of two, four, eight or sixteen cell charge states.

The present disclosure also relates to a non-volatile memory controller comprising for providing one or more log likelihood ratios (LLRs) of at least one bit representing a charge state of a target cell of a plurality of cells of a non-volatile memory for low-density parity check (LDPC) decoding, each of the plurality of cells capable of being in any one of a plurality of cell charge states. Here the controller comprises storing circuitry configured to store a look-up table comprising LLR values of at least one bit representing a charge state of a cell of the plurality of cells in the memory. The controller also comprises translation circuitry configured to determine a cell charge state of the target cell and a cell charge state of at least one of a plurality of neighboring cells. Further, the controller comprises a comparator configured to (i) calculate a value representative of the difference in at least one of a plurality of charge states of the target cell and the at least one of the plurality of neighboring cells, and (ii) compare the calculated value with at least one predetermined threshold value representative of the degree of disturbance effect the charge state of the at least one of the plurality of neighboring cells has on the charge state of the target cell. The controller also comprises look-up circuitry configured to (i) set at least one address bit of the look-up table if the calculated value exceeds the at least one threshold value, (ii) extract a new LLR value from the look-up table using the at least one address bit, and (iii) provide the new LLR value of the at least one bit representing a state of the target cell to the LDPC decoder.

In some implementations, the translation circuitry performs multiple reads on each target cell or neighboring cell at varying reference voltages to determine the cell charge state. In certain implementations, the translation circuitry also assigns a numerical value to each of the plurality of cell charge states. In some implementations, the plurality of cell charge states and their associated numerical values are stored in the non-volatile memory controller. In some implementations, the at least one threshold value varies according to the cell charge state. In certain implementations, the variation in threshold value with cell state may be linear or may be determined by a mathematical function. In certain implementations, the at least one threshold value varies according to a length of time since the target cell was programmed with charge. In some implementations, the at least one threshold value varies according to a total number of program and erase cycles the target cell has been subjected to.

In certain implementations, the comparator is also configured to count the number of times a LLR value in a particular location in the look-up table is assigned a LLR to the at least one bit representing the charge state of cell, and count the number of times the at least one bit representing the charge state of the cell was at a specific value. The comparator then calculates a new probability that the at least one bit representing the charge state of the cell is a specific value, and adjusts the LLR value at the specific location in the look-up table according to the new probability.

In some implementations, the memory is a flash memory. In certain implementations, the non-volatile memory comprises any one of: single level cells (SLCs), multi-level cells (MLCs), triple level cells (TLCs) and quadruple level cells (QLCs). In some implementations, the plurality of cells of the nonvolatile memory is capable of being in any one of two, four, eight or sixteen cell charge states.

Variations and modifications will occur to those of skill in the art after reviewing this disclosure. The disclosed features may be implemented, in any combination and subcombination (including multiple dependent combinations and subcombinations), with one or more other features described herein. The various features described or illustrated above, including any components thereof, may be combined or integrated in other systems. Moreover, certain features may be omitted or not implemented.

BRIEF DESCRIPTION OF THE DRAWINGS

The foregoing and other objects and advantages will be apparent upon consideration of the following detailed description, taken in conjunction with the accompanying drawings, in which like reference characters refer to like parts throughout, and in which.

DETAILED DESCRIPTION

Figure 1:
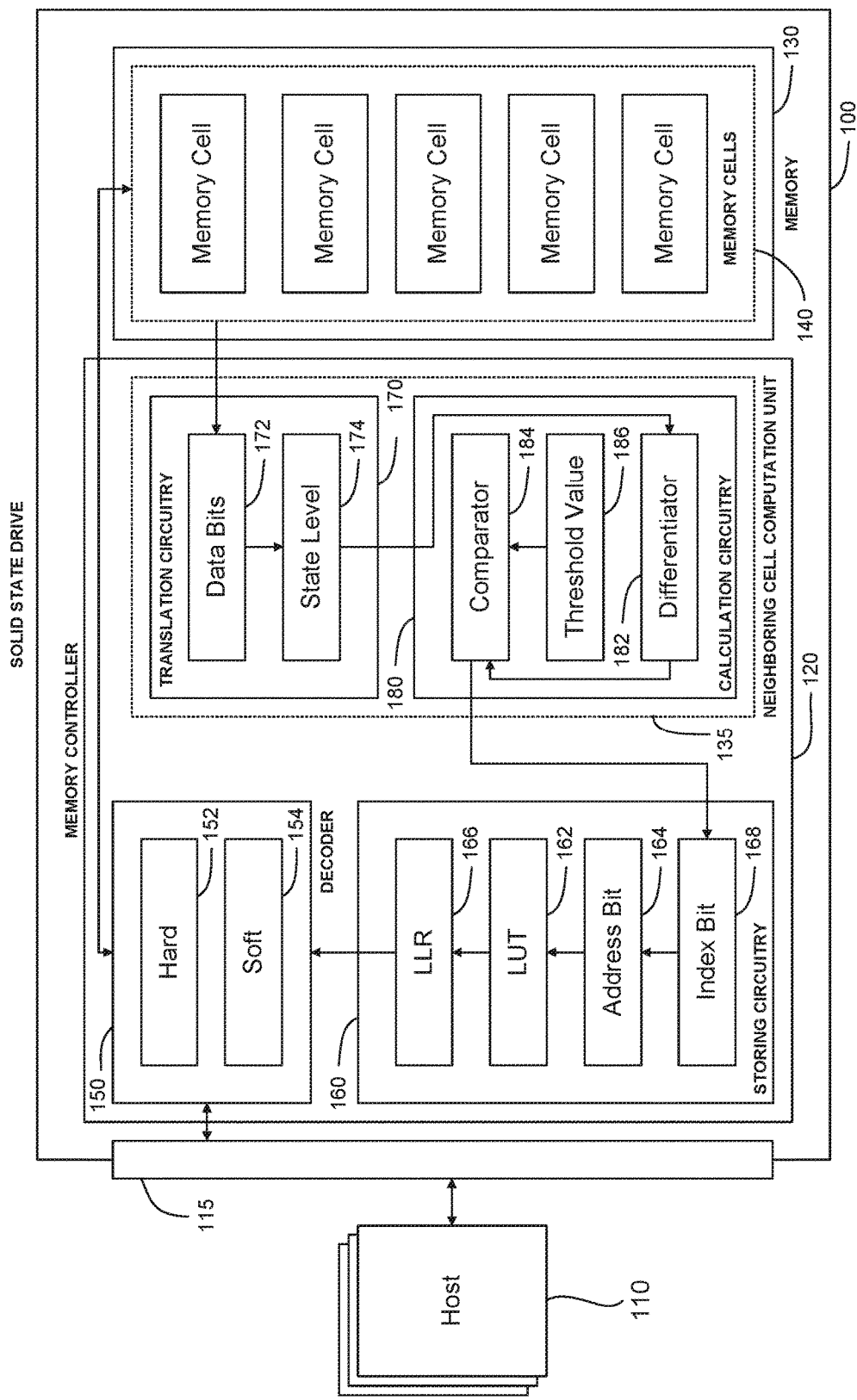
FIG. 1 shows a schematic representation of a solid-state drive (SSD), according to one or more embodiments of the present disclosure.

FIG. 1 illustrates a general solid state drive (SSD) flash memory 100 communicatively coupled to at least one host device 110 via an interface bus 115 (which may be SATA, SCSI, SAS, PCIe or similar). The SSD 100 comprises a flash memory controller 120 coupled to a memory array 130 comprising flash memory units 140. The memory controller 120 comprises an Error Correction Code (ECC) encoder/decoder such as an LDPC encoder/decoder 150. LDPC decoder 150 comprises a hard-decision LDPC decoder 152 and a soft-decision LDPC decoder 154. The input to the hard-decision decoder 152 is hard bits of data HB, while the input to the soft-decision decoder is a plurality n of soft bits SBn, as will be detailed in the sections that follow. The memory controller 120 also comprises storing circuitry 160. The memory controller 120 is also provided with an encoder (not shown for clarity) which may comprise an LDPC encoder and an ECC encoder. The memory controller 120 further comprises a neighboring cell computation unit 135 which reads data from the memory array 130 and provides data to the storing circuitry 160.

In one implementation, the memory controller 120 comprises storing circuitry 160 for storing at least one look-up table (LUT) 162 for referencing and indexing operations. The storing circuitry 160 may be implemented as a set of registers or as RAM. Such LUTs 162 use at least one address bit 164 to access the information stored in the LUT. An exemplary LUT 162 stores LLR values for each of the cells 140 of the memory array 130. Further, the LUT 162 may also use an index bit 168 for accessing specific alternate LLR values 166 located in LUT 162 based on various conditions as will be described in the sections that follow.

The neighboring cell computation unit 135 comprises translation circuitry 170 which takes information from the memory cells 140. As previously mentioned, the memory controller 120 makes multiple reads of the memory array 130 at varying threshold voltages so as to determine the charge state of each memory cell 140. Data bits from the memory cells 140 are read by the flash memory controller 120 and stored in a buffer 172. A charge state level 174 is then derived by performing a translation of the data bits 172 into a numerical value representing charge state level 174 using a predetermined look up table that is stored within the memory controller 120.

The neighboring cell computation unit 135 further comprises calculation circuitry 180 which receives the charge state level of each of the memory cells 140 from the translation circuitry 170. The calculation circuitry 180 may be implemented as combinatorial logic. A differentiator module 182 within the calculation circuitry 180 then determines the difference between the charge state level of a target cell and the charge state level of at least one neighboring cell. A comparator 184 then compares the difference in charge state levels of the target cell and the at least one neighboring cell with a threshold value for each state level. This threshold value is predetermined and stored in the memory controller 120 within a threshold value buffer 186. It should be noted that the correlation table used by the translation circuitry 170 and the threshold value buffer 186 used by the calculation circuitry 184 are predetermined by static values input to the system by a manufacturer, or values that have resulted from other processes occurring within the SSD 100. The comparator 184 then returns bits of information to the storing circuitry 160.

In a general implementation, upon receipt of a write command from a host device 110, the LDPC encoder 150 encodes data d transmitted from the host device 110 to the SSD 100 prior to storing the encoded data in the flash memory array 130. In order to encode the data, the encoder 150 uses a generator matrix G to produce a codeword c, where c=Gd. The codeword is then stored in the flash memory array 130. Upon receipt of a read command from a host device 110, a codeword c' is retrieved from the flash array 130. The codeword c' contains information related to the requested data in the read command. The retrieved codeword c' received by the controller 120 generally corresponds to an altered version of the codeword c output by the encoder 150 due to the presence of errors. The retrieved codeword c' is inputted into the decoder 152, 154 where the decoder uses a parity check matrix H and an LDPC decoding scheme iteratively to reduce the errors in the requested data d.

Figure 2:
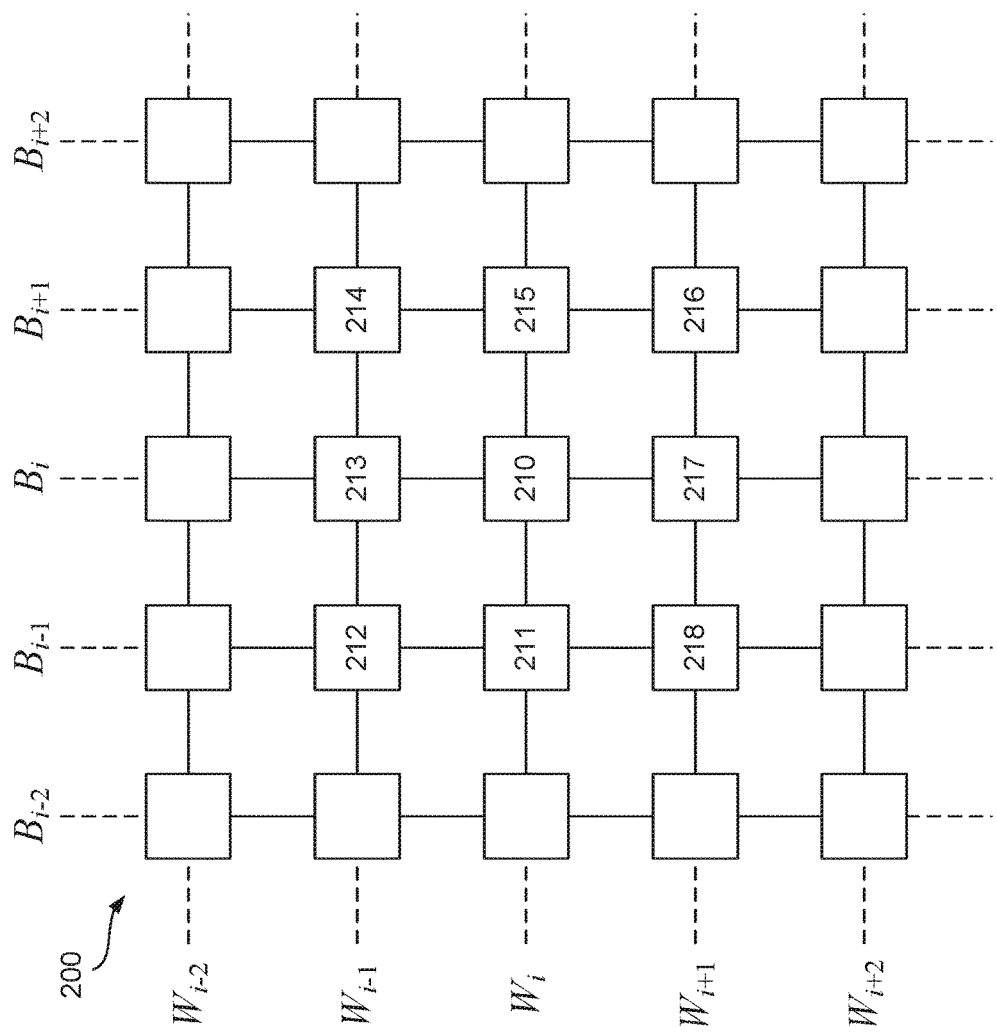
FIG. 2 illustrates a target cell and its surrounding cells according to an embodiment of the present disclosure.

The organizational structure of a NAND memory cell 200 will now be detailed with respect to FIG. 2 which illustrates a series of bit lines $B_{i-2}$, $B_{i-1}$, $B_i$, $B_{i+1}$ and $B_{i+2}$ intersecting with a series of word lines $W_{i-2}$, $W_{i-1}$, $W_i$, $W_{i+1}$ and $W_{i+2}$. A memory cell is formed at the intersection of the bit and word lines. A target cell 210 is surrounded by its 8-most neighboring cells 211-218. Due to the nature of the NAND architecture, coupling capacitance exists between the target cell 210 and each of the neighboring cells 211-218. Depending upon the data to be programmed into each cell, the target cell 210 may store a plurality of bits encoded as a charge state and the same for the neighboring cells. Neighboring cells (or a subset of neighboring cells) 211-218 may subsequently be programmed or erased thereby storing a bit containing either a '0' or a '1' in a manner similar to that of the target cell 210. The charge state level of each of the neighboring cells 211-218 will influence the charge state level of the target cell 210. Depending on the charge state in the neighboring cells 211-218, there would be an effect on the target cell 210. This effect is reflected as a voltage threshold shift for the target cell 210 that may appear more programmed when neighboring cells charge states are 'G', for example.

Figures 3, 4, 5:
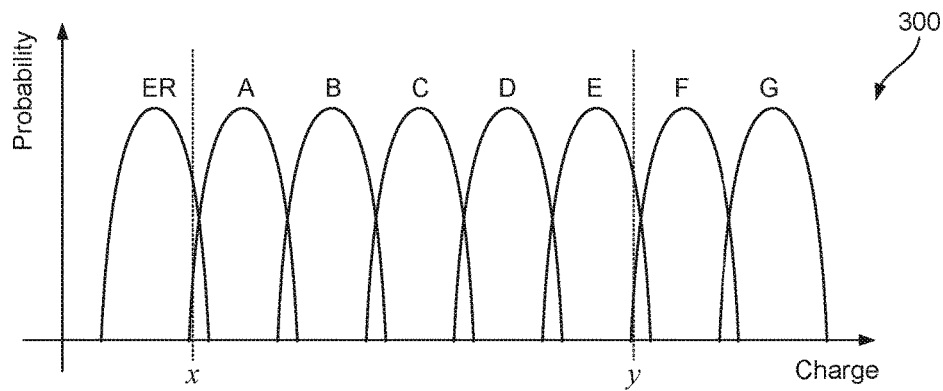
FIG. 3 illustrates the variation of probability with charge for cell charge states in the SSD of FIG. 1 for eight exemplary charge state levels, according to an embodiment of the present disclosure.
FIG. 4 shows a table with exemplary bit assignments in each of three data pages associated with the charge state levels of FIG. 3, according to an embodiment of the present disclosure.
FIG. 5 shows a table with the charge state levels of FIG. 3 and the respective values representative of the difference in charge states of a cell, according to an embodiment of the present disclosure.

FIG. 3 illustrates the variation in charge distribution in eight charge state levels of a triple layer cell (TLC): erase 'ER' and 'A' to 'G'. Each of the plots indicates the probability that a bit of a cell will have a charge in a respective state level. The table of FIG. 4 gives an exemplary assignment of the bits in each of three pages LSB, CSB and MSB. The bits in the LSB page are '1' for charge state levels ER, E, F and G. The bits in the CSB page are '1' for charge state levels ER, A, D and E. The bits in the MSB page are '1' for charge state levels ER, A, B and G.

Consider, as an example, TLC cells arranged in the configuration shown in FIG. 2. Cell 210 in FIG. 2 is a target cell, which has been programmed in the ER state and soft read information shows that the target cell 210 is actually in the region x of FIG. 3, between the ER and the A charge states. The LDPC soft decoder 154 decodes a codeword read from the LSB page. The soft information shows that this bit is in the region between the ER and A state, where the bit for the LSB page changes from '1' (in the ER state) to '0' (in the A state). The soft decoder 154 assigns an LLR for this bit to say that it was probably programmed as a '1' since it is closer to the ER state but it would be a relatively weak probability because it is close to the transition with the A state.

Now, consider the cells in this NAND page which are next to this cell, for example linear neighboring cells 211 and 215 to target cell 210 in FIG. 2. If these neighboring cells 211 and 215 are in the G state, i.e. the bits in these cells are '1', then they will pull the ER state of the target cell 210 towards the A state due to the disturbance effect of these cells. The soft information shows that the cell state of the target cell 210 is in the region of FIG. 3 indicated by x. The neighboring cells 211 and 215 have pulled the probability-charge distribution of target cell 210 towards the right of FIG. 3 due to each of their charge states being 'G'. The assigned probability of the bit of the target cell 210 being '1' should therefore be increased to reflect that it is more likely that the bit of the target cell 210 was programmed to be in the ER state than in the A state. If, for instance the first neighboring cell 211 was in the state B and the second neighboring cell 215 was in the state C, then the target cell 210 in the middle would not be affected so strongly towards the right of FIG. 3. The assigned probability of the target cell 210 being '1' should therefore not be increased.

As another example, consider a read in the CSB page where the soft information shows that the target cell 120 is in the region indicated by y in FIG. 3. Here the target cell 210 is in the region between the E state (where the CSB bit would be '1') and the F state (where the CSB bit would be '0'). It is closer to the 'E' state so we would assign an LLR to reflect that it was probably programmed as '1' in the E state. However, if the bits in the first neighboring cell 211 and the second neighboring cell 215 were both programmed into the ER state, it would become evident that the bit of the target cell 210 is being pulled to the left of FIG. 3. It would therefore be less likely that the bit in the target cell 210 was actually programmed as a '1', and thus the LLR assigned to the target cell 210 in this situation would be reduced to reflect this lower probability of the bit in the target cell 210 being a '1'.

A possible usage scenario of the soft decision LDPC decoder of the present disclosure is to a decoder with 6 channels of input data. For reading a TLC cell with an LSB bit assignment as in FIG. 4, the six channels could have the following designations. A hard-read bit (HB—in this example the LSB, but which may be equally the CSB or MSB) on channel 0, three soft reads Soft0, Soft1, Soft2 on channels 1 to 3, a CSB bit read on channel 4 and an MSB bit read on channel 5. This would provide soft input data with 8 levels of LLR and the CSB and MSB bits can be used to identify which transition any particular bit read is close to. This would optimize the assigned LLRs as it provides more realistic information of the programmed information of a bit by taking into account the disturbance effect the bits of the neighboring cells 211-218 have on the target cell 210. Information from these six channels can be used to address a look-up table containing LLR values for the cells in a memory page. An exemplary LLR LUT with the above mentioned channel designations as addressing bits of the LLR LUT is shown in Tables 1 and 2 below. According to an embodiment of the present disclosure, for a TLC cell, an additional LUT address bit could be used for neighboring bits by, for example, combining the states of the first neighboring cell 211 and the second neighboring cell 215 into a single bit of information, as will be described below.

Consider again the exemplary 8 states in the TLC cell as shown in FIG. 3 and again consider a target cell 210 which is in the ER state surrounded by first neighboring cell 211 and second neighboring cell 215, both in the G state, i.e. a situation where the backward cell 211, the target cell 210 and the forward cell 215 have the states G|ER|G. According to an embodiment of the present disclosure, a score or value of +7 would be given to the backwards cell 211 because it is 7 states to the right of the current cell. Similarly a score or value of +7 would be given to the second neighboring cell 215. The score or value representing the states of these cells would therefore be +7|ER|+7. The combined score or value representing the disturbance effect the first neighboring cell 211 and the second neighboring cell 215 have on the target cell 210 would be the sum of the scores or values on these cells, i.e. 7+7=+14. Such a score or value may also be described as a value representative of the difference in charge states of the target cell and at least one of a plurality of neighboring cells.

According to a further embodiment of the present disclosure, a programmable threshold value of +10 is set for the ER state of the target cell 210. Referring to Table 1 below, it can be seen that the addresses of the LUT has two spare bits (Bit 6 and Bit 7) for assignment. Thus, if the combined score or value representing the disturbance effect of the neighboring cells is more than this threshold value then an LUT address bit for the neighboring cells would be set to '1'. Accordingly, the address in the LUT for an LLR value which factors in the disturbance effect of the state of the neighboring cells would now be different due to the setting of the leading bit of the LUT address by using Bit 6 and Bit 7. Taking the example of address 16 for an Erase read in the LUT of Table 1, the address for the LLR would change from 00010000 for an LLR of −17 (where Bit 6 and Bit 7 are each set to '0') to 01010000 for an LLR of −7 (where Bit 6 and Bit 7 set to '1' and '0', respectively), as shown in Table 2. Table 2 is an LLR LUT which is similar to that of Table 1, however Bit 6 in Table 2 has been used to represent the disturbance effect of the state of the neighboring cells on the target cell. It follows that if the combined score or value representing the disturbance effect of the neighboring cells is less than the threshold value, the LUT address bit would be set to '0'. Thus, in the example here, if the charge state of the neighboring cells has no disturbance effect on the target cell, then address 00010000 in the LUT would be used to obtain an LLR value of −17. If the charge state of the neighboring cells has a disturbance effect on the target cell, then address 01010000 in the LUT would be used to obtain an LLR value of −7.

TABLE 1

LUT with 3 soft read bits

| Address | Bit 7 | Bit 6 | MSB Bit 5 | CSB Bit 4 | Soft2 Bit 3 | Soft1 Bit 2 | Soft0 Bit 1 | HB Bit 0 | LLR | |
|---|---|---|---|---|---|---|---|---|---|---|
| 0 | | | 0 | 0 | 0 | 0 | 0 | 0 | −17 | Unused |
| 1 | | | 0 | 0 | 0 | 0 | 0 | 1 | 16 | Unused |
| 2 | | | 0 | 0 | 0 | 0 | 1 | 0 | −49 | Unused |
| 3 | | | 0 | 0 | 0 | 0 | 1 | 1 | 48 | Unused |
| 4 | | | 0 | 0 | 0 | 1 | 0 | 0 | −81 | Unused |
| 5 | | | 0 | 0 | 0 | 1 | 0 | 1 | 80 | Unused |
| 6 | | | 0 | 0 | 0 | 1 | 1 | 0 | −81 | Unused |
| 7 | | | 0 | 0 | 0 | 1 | 1 | 1 | 80 | Unused |
| 8 | | | 0 | 0 | 1 | 0 | 0 | 0 | −113 | Unused |
| 9 | | | 0 | 0 | 1 | 0 | 0 | 1 | 112 | Unused |
| 10 | | | 0 | 0 | 1 | 0 | 1 | 0 | −113 | Unused |
| 11 | | | 0 | 0 | 1 | 0 | 1 | 1 | 112 | Unused |
| 12 | | | 0 | 0 | 1 | 1 | 0 | 0 | −113 | Unused |
| 13 | | | 0 | 0 | 1 | 1 | 0 | 1 | 112 | Unused |
| 14 | | | 0 | 0 | 1 | 1 | 1 | 0 | −113 | State C |
| 15 | | | 0 | 0 | 1 | 1 | 1 | 1 | 112 | State F |
| 16 | | | 0 | 1 | 0 | 0 | 0 | 0 | −17 | E read |
| 17 | | | 0 | 1 | 0 | 0 | 0 | 1 | 16 | E read |
| 18 | | | 0 | 1 | 0 | 0 | 1 | 0 | −49 | E read |
| 19 | | | 0 | 1 | 0 | 0 | 1 | 1 | 48 | E read |
| 20 | | | 0 | 1 | 0 | 1 | 0 | 0 | −81 | E read |
| 21 | | | 0 | 1 | 0 | 1 | 0 | 1 | 80 | E read |
| 22 | | | 0 | 1 | 0 | 1 | 1 | 0 | −81 | E read |
| 23 | | | 0 | 1 | 0 | 1 | 1 | 1 | 80 | E read |
| 24 | | | 0 | 1 | 1 | 0 | 0 | 0 | −113 | E read |
| 25 | | | 0 | 1 | 1 | 0 | 0 | 1 | 112 | E read |
| 26 | | | 0 | 1 | 1 | 0 | 1 | 0 | −113 | E read |
| 27 | | | 0 | 1 | 1 | 0 | 1 | 1 | 112 | E read |
| 28 | | | 0 | 1 | 1 | 1 | 0 | 0 | −113 | E read |
| 29 | | | 0 | 1 | 1 | 1 | 0 | 1 | 112 | E read |
| 30 | | | 0 | 1 | 1 | 1 | 1 | 0 | −113 | E read |
| 31 | | | 0 | 1 | 1 | 1 | 1 | 1 | 112 | E read |

It is evident from Table 2 below that by using the Bit 6 as the neighboring bit Nbit representing the disturbance effect of the charge state of the neighboring bits on a target cell, a more accurate LLR value is provided to the LDPC decoder. This will improve the LDPC decoding performance of the soft decoder which means that the next stage of error recovery would be required less often.

As a further example, if a target cell 210 which is in the G state is surrounded by first neighboring cell 211 and second neighboring cell 215, both in the ER state, i.e. a situation where the first neighboring cell 211, the target cell 210 and the second neighboring cell 215 have the states ER|G|ER, the score or value representing the states of these cells would therefore be −7|G|−7. The combined score or value representing the disturbance effect the first neighboring cell 211 and the second neighboring cell 215 have on the target cell 210 would be the sum of the scores or values on these cells, i.e. (−7)+(−7)=−14. Assuming a programmable threshold value of −10 for the G state of the target cell 210, if the combined score or value representing the disturbance effect of the neighboring cells is more than this threshold value then an LUT address bit for the neighboring cells would be set to '1'. It follows that if the combined score or value representing the disturbance effect of the neighboring cells is less than the threshold value, the LUT address bit would be set to '0'.

FIG. 5 lists the various states of a target cell 210 and the associated minimum and maximum scores possible considering the disturbance effect of the states of the backward cell 211 and the forward cell 215 in the cell array as depicted in FIG. 2. FIG. 5 also provides threshold values used for setting Nbit in the LLR LUT of Table 2. The final column in FIG. 5 shows the neighbor combinations where the score is beyond the example threshold. The threshold values are exemplary and are programmed into registers by firmware. The threshold values vary according to the cell charge state of the target cell 210. According to an embodiment of the present disclosure, a variation in threshold value could be made dependent on the length of time since the target cell 210 was last programmed with charge. According to a further embodiment of the present disclosure, the variation in threshold value could be made dependent on the total number of program and erase cycles that the target cell 210 has been subjected to. According to an embodiment of the present disclosure, the variation in threshold value with cell charge of the target cell 210 may be linear or may be determined by a mathematical function.

Referring back to FIG. 2, it has been shown that the charge state of linear cell neighbors 211, 213, 215 and 217 to target cell 210 have a greater disturbance effect on the charge state of the target cell 210 than the charge state of diagonal cell neighbors 212, 214, 216 and 218 to target cell 210.

Referring to FIG. 1, the soft decision LDPC decoder 154 has a measurement mode where it is possible to count the number of times a particular location in the LLR LUT is used for assigning the LLR and the number of times that a bit was a '1' in the decoded codeword. This information allows the probabilities of a bit of a cell being '1' to be measured, and the LLR values in the LUT of Table 2 to be updated. It is possible therefore to measure the effect that the charge state levels of the backward cell 211 and forward cell 215 have on the target cell 210, and hence measure the probability that should be assigned.

It will be understood that while FIG. 3 depicts the eight charge state levels in a triple layer (TLC) NAND cell, the number of charge state levels would vary for other cell architectures. For example a single level cell (SLC) will have 2 charge state levels, multiple level NAND (MLC) will have 4 charge state levels, a quadruple level (QLC) NAND will have 16 charge state levels, and so on. The number of cell state levels available would impact the size of the LLR LUT of Table 2 as the number of available addressing bits will change. Further, it will be understood that while MSB, CSB and HB are used in Table 2, any selection of addressing bits where HB={LSB, CSB or MSB}, with soft bits={ (MSB+CSB), (MSB+LSB), or (LSB+CSB)} respectively can be used for addressing the LLR LUT. While LSB, CSB and MSB relate to 3 bits per cell TLC NAND, it should be noted that any number of bits per cell may be used, including SLC, MLC and QLC. Additionally, multiple LLR LUTs can be stored in the controller, each relating to a possible combination of addressing bits.

Figure 6:
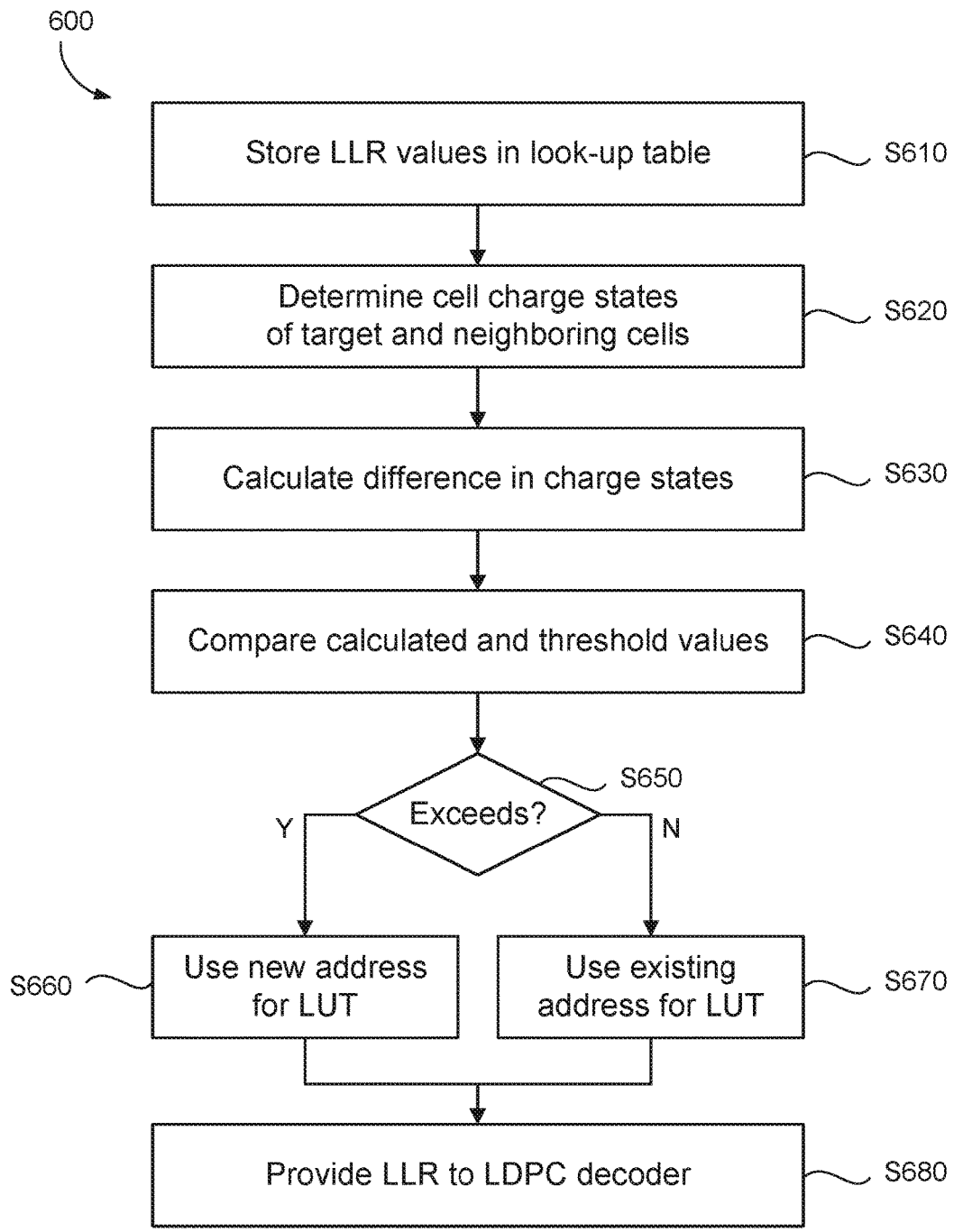
FIG. 6 illustrates a method of providing a log likelihood ratio (LLR) of at least one bit representing a charge state of a target cell of a plurality of cells in a non-volatile memory to an low-density parity check (LDPC) decoder, according to an embodiment of the present disclosure.

A method of soft decision LDPC decoding using LLR values of improved accuracy will not be described in relation to FIG. 6. The method 600 begins at step S610 in which LLR values for the memory cells in a memory array are stored in the memory controller. As previously mentioned, multiple LLR LUTs may be stored in the controller. The method then processes to step S620 where the charge state levels of a target cell and at least one neighboring cell is determined. A value that represents the difference between in charge states of the target cell and the at least one neighboring cell is then calculated in step S630. In decision step S650, this calculated value is then compared to the threshold value for the target cell state, as listed in FIG. 5. If the calculated value is more than the threshold value (i.e. a 'Yes' in step S650), a bit representing the disturbance effect of the at least one neighboring cell is set to '1' and used to address a different location of the LLR LUT, per step S660 in FIG. 6. If the calculated value does not exceed the threshold value (i.e. a 'No' in step S650), a bit representing the disturbance effect of the at least one neighboring cell is not set to '1' and LUT address used to obtain the LLR value is not changed (step S670 in FIG. 6). The LLR value obtained from the LLR LUT is then provided to the soft decision LDPC decoder for decoding the codeword.

TABLE 2

LUT for with 3 soft read bits and neighboring cell threshold bit (continued)

| Address | Bit 7 | NBits Bit 6 | MSB Bit 5 | CSB Bit 4 | Soft2 Bit 3 | Soft1 Bit 2 | soft0 Bit 1 | HB Bit 0 | LLR | |
|---|---|---|---|---|---|---|---|---|---|---|
| 0 | 0 | 0 | 0 | 0 | 0 | 0 | 0 | 0 | −17 | Unused |
| 1 | 0 | 0 | 0 | 0 | 0 | 0 | 0 | 1 | 16 | Unused |
| 2 | 0 | 0 | 0 | 0 | 0 | 0 | 1 | 0 | −49 | Unused |
| 3 | 0 | 0 | 0 | 0 | 0 | 0 | 1 | 1 | 48 | Unused |
| 4 | 0 | 0 | 0 | 0 | 0 | 1 | 0 | 0 | −81 | Unused |
| 5 | 0 | 0 | 0 | 0 | 0 | 1 | 0 | 1 | 80 | Unused |
| 6 | 0 | 0 | 0 | 0 | 0 | 1 | 1 | 0 | −81 | Unused |
| 7 | 0 | 0 | 0 | 0 | 0 | 1 | 1 | 1 | 80 | Unused |
| 8 | 0 | 0 | 0 | 0 | 1 | 0 | 0 | 0 | −113 | Unused |
| 9 | 0 | 0 | 0 | 0 | 1 | 0 | 0 | 1 | 112 | Unused |
| 10 | 0 | 0 | 0 | 0 | 1 | 0 | 1 | 0 | −113 | Unused |
| 11 | 0 | 0 | 0 | 0 | 1 | 0 | 1 | 1 | 112 | Unused |
| 12 | 0 | 0 | 0 | 0 | 1 | 1 | 0 | 0 | −113 | Unused |
| 13 | 0 | 0 | 0 | 0 | 1 | 1 | 0 | 1 | 112 | Unused |
| 14 | 0 | 0 | 0 | 0 | 1 | 1 | 1 | 0 | −113 | State C |
| 15 | 0 | 0 | 0 | 0 | 1 | 1 | 1 | 1 | 112 | State F |
| 16 | 0 | 0 | 0 | 1 | 0 | 0 | 0 | 0 | −17 | E read |
| 17 | 0 | 0 | 0 | 1 | 0 | 0 | 0 | 1 | 16 | E read |
| 18 | 0 | 0 | 0 | 1 | 0 | 0 | 1 | 0 | −49 | E read |

TABLE 2-continued

LUT for with 3 soft read bits and neighboring cell threshold bit (continued)

| Address | NBits Bit 7 | MSB Bit 6 | CSB Bit 5 | Soft2 Bit 4 | Soft1 Bit 3 | soft0 Bit 2 | HB Bit 1 | Bit 0 | LLR | |
|---|---|---|---|---|---|---|---|---|---|---|
| 19 | 0 | 0 | 1 | 0 | 0 | 1 | 1 | | 48 | E read |
| 20 | 0 | 0 | 1 | 0 | 1 | 0 | 0 | | −81 | Unused |
| 21 | 0 | 0 | 1 | 0 | 1 | 0 | 1 | | 80 | Unused |
| 22 | 0 | 0 | 1 | 0 | 1 | 1 | 0 | | −81 | E read |
| 23 | 0 | 0 | 1 | 0 | 1 | 1 | 1 | | 80 | E read |
| 24 | 0 | 0 | 1 | 1 | 0 | 0 | 0 | | −113 | Unused |
| 25 | 0 | 0 | 1 | 1 | 0 | 0 | 1 | | 112 | Unused |
| 26 | 0 | 0 | 1 | 1 | 0 | 1 | 0 | | −113 | Unused |
| 27 | 0 | 0 | 1 | 1 | 0 | 1 | 1 | | 112 | Unused |
| 28 | 0 | 0 | 1 | 1 | 1 | 0 | 0 | | −113 | Unused |
| 29 | 0 | 0 | 1 | 1 | 1 | 0 | 1 | | 112 | Unused |
| 30 | 0 | 0 | 1 | 1 | 1 | 1 | 0 | | −113 | E read |
| 31 | 0 | 0 | 1 | 1 | 1 | 1 | 1 | | 112 | E read |
| 32 | 1 | 0 | 0 | 0 | 0 | 0 | 0 | | −17 | Unused |
| 33 | 1 | 0 | 0 | 0 | 0 | 0 | 1 | | 16 | Unused |
| 34 | 1 | 0 | 0 | 0 | 0 | 1 | 0 | | −49 | Unused |
| 35 | 1 | 0 | 0 | 0 | 0 | 1 | 1 | | 48 | Unused |
| 36 | 1 | 0 | 0 | 0 | 1 | 0 | 0 | | −81 | Unused |
| 37 | 1 | 0 | 0 | 0 | 1 | 0 | 1 | | 80 | Unused |
| 38 | 1 | 0 | 0 | 0 | 1 | 1 | 0 | | −81 | Unused |
| 39 | 1 | 0 | 0 | 0 | 1 | 1 | 1 | | 80 | Unused |
| 40 | 1 | 0 | 0 | 1 | 0 | 0 | 0 | | −113 | Unused |
| 41 | 1 | 0 | 0 | 1 | 0 | 0 | 1 | | 112 | Unused |
| 42 | 1 | 0 | 0 | 1 | 0 | 1 | 0 | | −113 | Unused |
| 43 | 1 | 0 | 0 | 1 | 0 | 1 | 1 | | 112 | Unused |
| 44 | 1 | 0 | 0 | 1 | 1 | 0 | 0 | | −113 | Unused |
| 45 | 1 | 0 | 0 | 1 | 1 | 0 | 1 | | 112 | Unused |
| 46 | 1 | 0 | 0 | 1 | 1 | 1 | 0 | | −113 | State C |
| 47 | 1 | 0 | 0 | 1 | 1 | 1 | 1 | | 112 | State F |
| 48 | 1 | 0 | 1 | 0 | 0 | 0 | 0 | | −7 | E read |
| 49 | 1 | 0 | 1 | 0 | 0 | 0 | 1 | | 26 | E read |
| 50 | 1 | 0 | 1 | 0 | 0 | 1 | 0 | | −39 | E read |
| 51 | 1 | 0 | 1 | 0 | 0 | 1 | 1 | | 58 | E read |
| 52 | 1 | 0 | 1 | 0 | 1 | 0 | 0 | | −81 | Unused |
| 53 | 1 | 0 | 1 | 0 | 1 | 0 | 1 | | 80 | Unused |
| 54 | 1 | 0 | 1 | 0 | 1 | 1 | 0 | | −71 | E read |
| 55 | 1 | 0 | 1 | 0 | 1 | 1 | 1 | | 90 | E read |
| 56 | 1 | 0 | 1 | 1 | 0 | 0 | 0 | | −113 | Unused |
| 57 | 1 | 0 | 1 | 1 | 0 | 0 | 1 | | 112 | Unused |
| 58 | 1 | 0 | 1 | 1 | 0 | 1 | 0 | | −113 | Unused |
| 59 | 1 | 0 | 1 | 1 | 0 | 1 | 1 | | 112 | Unused |
| 60 | 1 | 0 | 1 | 1 | 1 | 0 | 0 | | −113 | Unused |
| 61 | 1 | 0 | 1 | 1 | 1 | 0 | 1 | | 112 | Unused |
| 62 | 1 | 0 | 1 | 1 | 1 | 1 | 0 | | −103 | E read |
| 63 | 1 | 0 | 1 | 1 | 1 | 1 | 1 | | 122 | E read |

The foregoing is merely illustrative of the principles of the disclosure, and the apparatuses can be practiced by other than the described implementations, which are presented for purposes of illustration and not of limitation. Variations and modifications will occur to those of skill in the art after reviewing this disclosure. The disclosed features may be implemented, in any combination and subcombination (including multiple dependent combinations and subcombinations), with one or more other features described herein. The various features described or illustrated above, including any components thereof, may be combined or integrated in other systems. Moreover, certain features may be omitted or not implemented.

Examples of changes, substitutions, and alterations are ascertainable by one skilled in the art and could be made without departing from the scope of the information disclosed herein. All references cited herein are incorporated by reference in their entirety and made part of this application.

Other objects, advantages and embodiments of the various aspects of the present invention will be apparent to those who are skilled in the field of the invention and are within the scope of the description and the accompanying Figures. For example, but without limitation, structural or functional elements might be rearranged consistent with the present invention. Similarly, principles according to the present invention could be applied to other examples, which, even if not specifically described here in detail, would nevertheless be within the scope of the present invention.

We claim:

1. A method of providing a log likelihood ratio (LLR) of at least one bit representing a charge state of a target cell of a plurality of cells of a non-volatile memory to a low-density parity check (LDPC) decoder, each of the plurality of cells capable of being in any one of a plurality of cell charge states, the method comprising:

storing in a non-volatile memory controller, a look-up table for storing LLR values of at least one bit representing a charge state of a cell of the plurality of cells in the memory;

determining a cell charge state of the target cell and a cell charge state of at least one of a plurality of neighboring cells;

calculating a value representative of the difference in at least one of a plurality of charge states of the target cell and the at least one of the plurality of neighboring cells;

comparing the calculated value with at least one predetermined threshold value representative of the degree of disturbance effect the charge state of the at least one of the plurality of neighboring cells has on the charge state of the target cell;

setting at least one address bit of an address to the look-up table if the calculated value exceeds the at least one threshold value;

extracting a new LLR value from the look-up table using the at least one address bit; and providing the new LLR value of the at least one bit representing the charge state of the target cell to the LDPC decoder.

2. The method of claim 1, wherein determining the cell charge state of the target cell or neighboring cell comprises performing multiple reads on each target cell or neighboring cell at varying threshold voltages.

3. The method of claim 1, further comprising assigning a numerical value to each of the plurality of cell charge states.

4. The method of claim 3, wherein the plurality of cell charge states and their associated numerical values are stored in the non-volatile memory controller.

5. The method of claim 1, wherein the at least one threshold value varies according to the cell charge state of the target cell.

6. The method of claim 5, wherein the variation in threshold value with cell charge state of the target cell may be linear or may be determined by a mathematical function.

7. The method of claim 1, wherein the at least one threshold value varies according to a length of time since the target cell was programmed with charge.

8. The method of claim 1, wherein the at least one threshold value varies according to a total number of program and erase cycles the target cell has been subjected to.

9. The method of claim 1, further comprising:
counting, by the non-volatile memory controller, the number of times a LLR value in a particular location in the look-up table is used to assign a LLR to the at least one bit representing the charge state of a cell,
counting, by the non-volatile memory controller, the number of times the at least one bit representing the charge state of the cell was a specific value at a specific location in the look-up table;
calculating a new probability the at least one bit representing the charge state of the cell is the specific value; and
adjusting the LLR value at the specific location in the look-up table according to the new probability.

10. The method of claim 1, wherein the non-volatile memory is a flash memory.

11. The method of claim 1, wherein the non-volatile memory comprises any one of: single level cells (SLCs), multi-level cells (MLCs), triple level cells (TLCs) and quadruple level cells (QLCs).

12. The method of claim 1, wherein the plurality of cells of the non-volatile memory is capable of being in any one of two, four, eight or sixteen cell charge states.

13. A non-volatile memory controller comprising for providing one or more log likelihood ratios (LLRs) of at least one bit representing a charge state of a target cell of a plurality of cells of a non-volatile memory for low-density parity check (LDPC) decoding, each of the plurality of cells capable of being in any one of a plurality of cell charge states, the controller comprising:

storing circuitry configured to store a look-up table comprising LLR values of at least one bit representing a charge state of a cell of the plurality of cells in the memory;

translating circuitry configured to determine a cell charge state of the target cell and a cell charge state of at least one of a plurality of neighboring cells based on data bits read from the target cell and the at least one of a plurality of neighboring cells;

a comparator configured to:
calculate a value representative of the difference in at least one of a plurality of charge states of the target cell and the at least one of the plurality of neighboring cells, and
compare the calculated value with at least one predetermined threshold value representative of the degree of disturbance effect the charge state of the at least one of the plurality of neighboring cells has on the charge state of the target cell;

look-up circuitry configured to:
set at least one address bit of the look-up table if the calculated value exceeds the at least one threshold value,
extract a new LLR value from the look-up table using the at least one address bit, and
provide the new LLR value of the at least one bit representing a state of the target cell to the LDPC decoder.

14. The non-volatile memory controller of claim 13, wherein the translating circuitry performs multiple reads on each target cell or neighboring cell at varying reference voltages to read the data bits.

15. The non-volatile memory controller of claim 13, wherein the translating circuitry also assigns a numerical value to each of the plurality of cell charge states.

16. The non-volatile memory controller of claim 15, wherein the plurality of cell charge states and their associated numerical values are stored in the non-volatile memory controller.

17. The non-volatile memory controller of claim 13, wherein the at least one threshold value varies according to the cell charge state.

18. The non-volatile memory controller of claim 17, wherein the variation in threshold value with cell state may be linear or may be determined by a mathematical function.

19. The non-volatile memory controller of claim 13, wherein the at least one threshold value varies according to a length of time since the target cell was programmed with charge.

20. The non-volatile memory controller of claim 13, wherein the at least one threshold value varies according to a total number of program and erase cycles the target cell has been subjected to.

21. The non-volatile memory controller of claim 13, wherein the comparator is also configured to:
count the number of times a LLR value in a particular location in the look-up table is assigned a LLR to the at least one bit representing the charge state of cell;
count the number of times the at least one bit representing the charge state of the cell was at a specific value;
calculate a new probability the at least one bit representing the charge state of the cell is a specific value and adjust the LLR value at the specific location in the look-up table according to the new probability.

22. The non-volatile memory controller of claim 13, wherein the memory is a flash memory.

23. The non-volatile memory controller of claim 13, wherein the non-volatile memory comprises any one of: single level cells (SLCs), multi-level cells (MLCs), triple level cells (TLCs) and quadruple level cells (QLCs).

24. The non-volatile memory controller of claim 13, wherein the plurality of cells of the non-volatile memory is capable of being in any one of two, four, eight or sixteen cell charge states.

* * * * *